US012805346B2

(12) United States Patent
Yan et al.

(10) Patent No.: US 12,805,346 B2
(45) Date of Patent: Nov. 17, 2026

(54) FLEXIBLE FILAMENT SPLICING STRUCTURES

(71) Applicant: HANGZHOU HANGKE OPTOELECTRONICS CO., LTD., Hangzhou (CN)

(72) Inventors: Qianjun Yan, Hangzhou (CN); Zhaozhang Zheng, Hangzhou (CN); Jun Li, Hangzhou (CN); Hai Wang, Hangzhou (CN)

(73) Assignee: HANGZHOU HANGKE OPTOELECTRONICS CO., LTD., Hangzhou (CN)

( * ) Notice: Subject to any disclaimer, the term of this patent is extended or adjusted under 35 U.S.C. 154(b) by 335 days.

(21) Appl. No.: 18/655,306

(22) Filed: May 5, 2024

(65) Prior Publication Data

US 2024/0379576 A1 Nov. 14, 2024

(30) Foreign Application Priority Data

May 12, 2023 (CN) ........................ 202321141808.2

(51) Int. Cl.

*H10W 70/60* (2026.01)
*H10H 20/857* (2025.01)
*H10W 70/67* (2026.01)
*H10W 90/00* (2026.01)

(52) U.S. Cl.

CPC ........ *H10W 70/611* (2026.01); *H10H 20/857* (2025.01); *H10W 70/688* (2026.01); *H10W 90/00* (2026.01)

(58) Field of Classification Search

CPC .............. H10W 70/611; H10W 70/688; H10H 20/857; H05K 1/142; F21Y 2103/10; F21Y 2115/10

See application file for complete search history.

(56) References Cited

U.S. PATENT DOCUMENTS

| | | | | |
|---|---|---|---|---|
| 2019/0013275 | A1* | 1/2019 | Sunshine | D02G 3/441 |
| 2019/0386185 | A1* | 12/2019 | Jiang | F21K 9/232 |
| 2020/0053875 | A1* | 2/2020 | Holec | H05K 1/0298 |
| 2020/0124242 | A1* | 4/2020 | Creusen | F21S 4/24 |
| 2021/0036201 | A1* | 2/2021 | Fujikawa | F21K 9/00 |
| 2021/0116077 | A1* | 4/2021 | Jiang | F21V 19/005 |

FOREIGN PATENT DOCUMENTS

| | | |
|---|---|---|
| CN | 206672965 U | 11/2017 |
| CN | 213656390 U | 7/2021 |

* cited by examiner

*Primary Examiner* — Brian Turner
(74) *Attorney, Agent, or Firm* — PORUS IP LLC

(57) ABSTRACT

The embodiments of the present disclosure provide a flexible filament splicing structure, comprising a plurality of flexible filaments. Each of the plurality of flexible filaments includes a flexible substrate and at least one LED chip. The flexible substrate is provided with a conductive circuit layer. The at least one LED chip is disposed on the flexible substrate. The at least one LED chip is electrically connected with the conductive circuit layer. Two adjacent flexible filaments are electrically spliced with each other to enable the plurality of flexible filaments to form an integrated spliced structure.

18 Claims, 12 Drawing Sheets

FLEXIBLE FILAMENT SPLICING STRUCTURES

CROSS-REFERENCES TO RELATED APPLICATIONS

This application claims priority of Chinese Patent Application No. 202321141808.2, filed on May 12, 2023, the content of which is entirely incorporated herein by reference.

TECHNICAL FIELD

The present disclosure relates to the technical field of flexible filaments, and in particular to a flexible filament splicing structure.

BACKGROUND

At present, light-emitting diode (LED) filament lamps mostly use flexible filaments as light-emitting elements. The flexible filament, based on high-voltage light-emitting diode (HVLED) technology, consists of multiple flip-flop LED chips connected in series to form HVLEDs modules, realizing the advantages of low temperature and low energy consumption. The flexible filament is made of copper foil laminated with polymer film as the base material, which is slender, soft and malleable, and can be bent and folded to form different shapes to provide different types of decorative lamps and lanterns, and thus is widely favored by consumers.

At present, there is no encapsulation equipment to realize the encapsulation of ultra-long flexible filaments, especially when the flexible filaments with different specifications and lengths are needed, it is impossible to complete and obtain the flexible filaments of the specifications directly through the encapsulation equipment, which means that the corresponding encapsulation equipment may encapsulate the flexible filaments with a fixed specification and length. When the flexible filaments cannot meet the usage requirements, it may only take several filaments to be connected in series through a tandem module, which results in the formation of a large gap between two adjacent filaments and affects the continuity of the flexible filaments. Several filaments connected in series cannot realize continuous light emission as there are interruptions.

At present, there is no encapsulation equipment for preparing the ultra-long flexible filaments on the market, and the processes such as gold plating, printing, and patch on a flexible printed circuit board (PCB) requires professional equipment and technology. In addition, the customized equipment may greatly increase the production cost.

Therefore, it is necessary to provide an improved flexible filament splicing structure to solve the problem of encapsulating the ultra-long filament.

SUMMARY

One or more embodiments of the present disclosure provide a flexible filament splicing structure. The splicing structure may comprise a plurality of flexible filaments. Each of the plurality flexible filaments may include a flexible substrate and at least one LED chip. The flexible substrate may be provided with a conductive circuit layer. The at least one LED chip may be disposed on the flexible substrate. The at least one LED chip may be electrically connected with the conductive circuit layer. Two adjacent flexible filaments may be electrically spliced with each other to enable the plurality of the flexible filaments to form an integrated spliced structure.

In some embodiments, at least two conductive connection ends may be disposed on each of the plurality of flexible filaments. The at least two conductive connection ends may be electrically connected with the conductive circuit layer. The two adjacent flexible filaments may be electrically spliced with each other through respective conductive connection ends to form the integrated spliced structure.

In some embodiments, the at least two conductive connection ends may protrude from two ends of each of the plurality of flexible filaments, respectively.

In some embodiments, the two adjacent flexible filaments may be electrically spliced with each other by soldering.

In some embodiments, each of the at least two conductive connection ends may be provided with at least one solder hole. The at least one solder hole provided in the at least two conductive connection ends of each of the two adjacent flexible filaments may be aligned and overlapped to be electrically spliced by soldering and fixing.

In some embodiments, the soldering may include tin soldering.

In some embodiments, the two adjacent flexible filaments may be bonded to be electrically spliced through a conductive adhesive.

In some embodiments, splicing positions of the two adjacent flexible filaments may be coated and cured with a fluorescent adhesive.

In some embodiments, when a plurality of LED chips are provided, the plurality of the LED chips may be connected in series or parallel through the conductive circuit layer.

In some embodiments, in the integrated spliced structure formed by the plurality of flexible filaments, one or two contact pieces may be disposed at one end of the flexible filament located at an end, and the one or two contact pieces may be electrically connected with the conductive circuit layer.

In some embodiments, in the integrated spliced structure formed by the plurality of flexible filaments, one end of a first flexible filament may be provided with a first contact piece electrically connected with the conductive circuit layer, the other end of the first flexible filament may be electrically connected with an adjacent flexible filament; one end of a last flexible filament may be electrically connected with an adjacent flexible filament, and the other end of the last flexible filament may be provided with a second contact piece electrically connected with the conductive circuit layer.

In some embodiments, in the integrated spliced structure formed by the plurality of flexible filaments, one end of the first flexible filament may be provided with a third contact piece and a fourth contact piece electrically connected with the conductive circuit layer; and one end of the last flexible filament may be electrically connected with the adjacent flexible filament.

In some embodiments, the other end of the last flexible filament may be provided with a fifth contact piece electrically connected with the conductive circuit layer; or the other end of the last flexible filament may be provided with a connection structure.

In some embodiments, a plurality of bonding pads may be disposed on the conductive circuit layer. The plurality of bonding pads may be electrically connected with the conductive circuit layer. The at least one LED chip may be disposed on the plurality of bonding pads.

In some embodiments, the conductive circuit layer may be disposed on a front side and a reverse side of the flexible substrate, respectively. At least two LED chips may be arranged on the front side and the reverse side of the flexible substrate, respectively.

In some embodiments, the front side and the reverse side of the flexible substrate may be coated with a fluorescent adhesive, respectively. The at least two LED chips may be encapsulated in the fluorescent adhesive.

In some embodiments, the flexible filament splicing structure may further comprise a reinforcing plate. The reinforcing plate may be disposed at a position of the flexible substrate where the at least one LED chip is located.

In some embodiments, an area of the reinforcing plate may be greater than an area of the at least one LED chip.

In some embodiments, the conductive circuit layer may be provided with a conductive circuit. The conductive circuit may be arranged on the flexible substrate in a serpentine shape.

In some embodiments, the flexible filament splicing structure may further comprise at least one reinforcing layer. The at least one reinforcing layer may be disposed on the flexible substrate. The at least one reinforcing layer may have a cellular mesh structure.

BRIEF DESCRIPTION OF THE DRAWINGS

The present disclosure will be further illustrated by way of exemplary embodiments, which will be described in detail with reference to the accompanying drawings. These embodiments are not limiting, and in these embodiments, the same numbering denotes the same structure, wherein.

DETAILED DESCRIPTION

Figure 1:
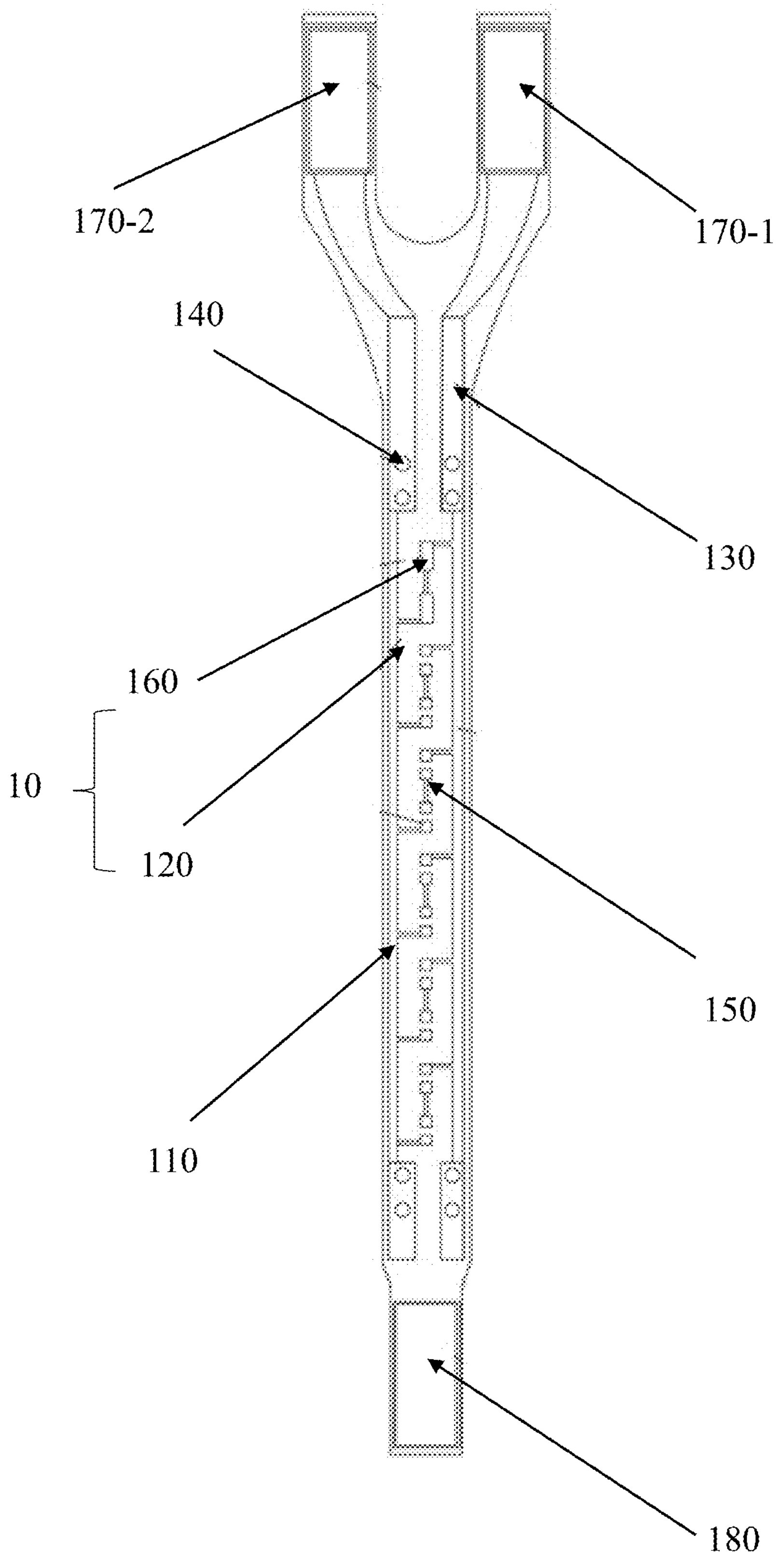
FIG. 1 is a schematic structural diagram illustrating a plurality of flexible filaments according to some embodiments of the present disclosure.

In order to more clearly illustrate the technical solutions of the embodiments of the present disclosure, the following briefly introduces the drawings that need to be used in the description of the embodiments. Apparently, the accompanying drawings in the following description are only some examples or embodiments of the present disclosure, and those skilled in the art can also apply the present disclosure to other similar scenarios according to the drawings without creative effort. Unless obviously obtained from the context or the context illustrates otherwise, the same numeral in the drawings refers to the same structure or operation.

The flowchart is used in the present disclosure to illustrate the operations performed by the system according to the embodiments of the present disclosure. It should be understood that the preceding or following operations are not necessarily performed in the exact order. Instead, various steps may be processed in reverse order or simultaneously. Meanwhile, other operations may be added to these procedures, or a certain step or steps may be removed from these procedures.

Figure 2:
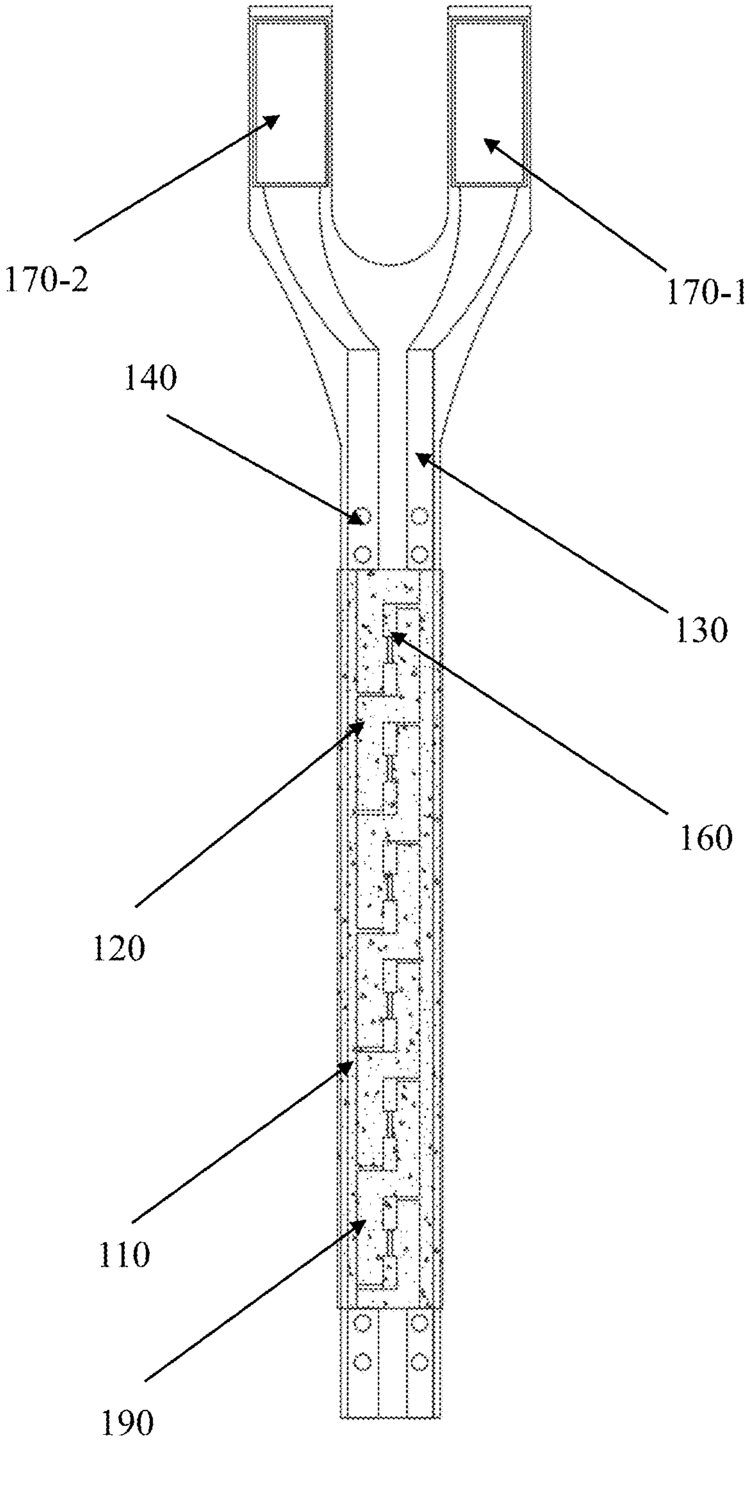
FIG. 2 is a schematic structural diagram illustrating a plurality of flexible filaments according to some embodiments of the present disclosure.
Figure 3:
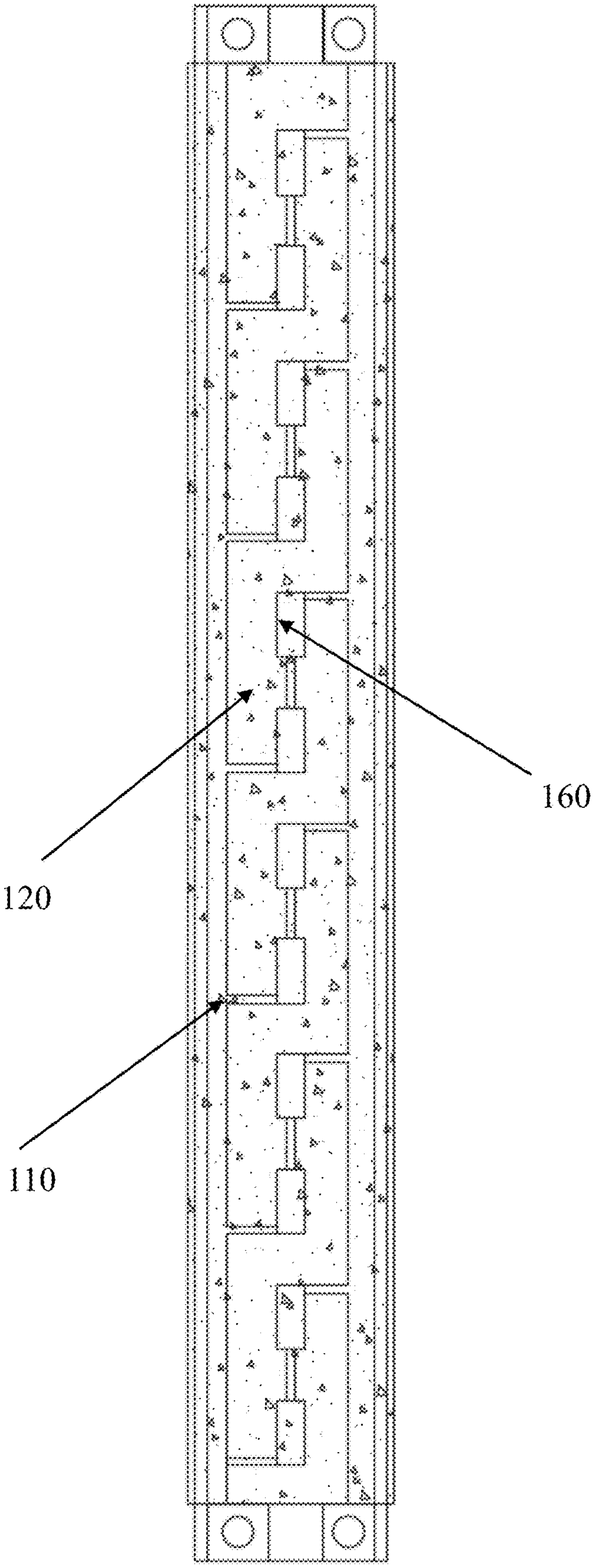
FIG. 3 is a schematic diagram illustrating a partial enlargement of a flexible filament splicing structure according to some embodiments of the present disclosure.
Figure 4:
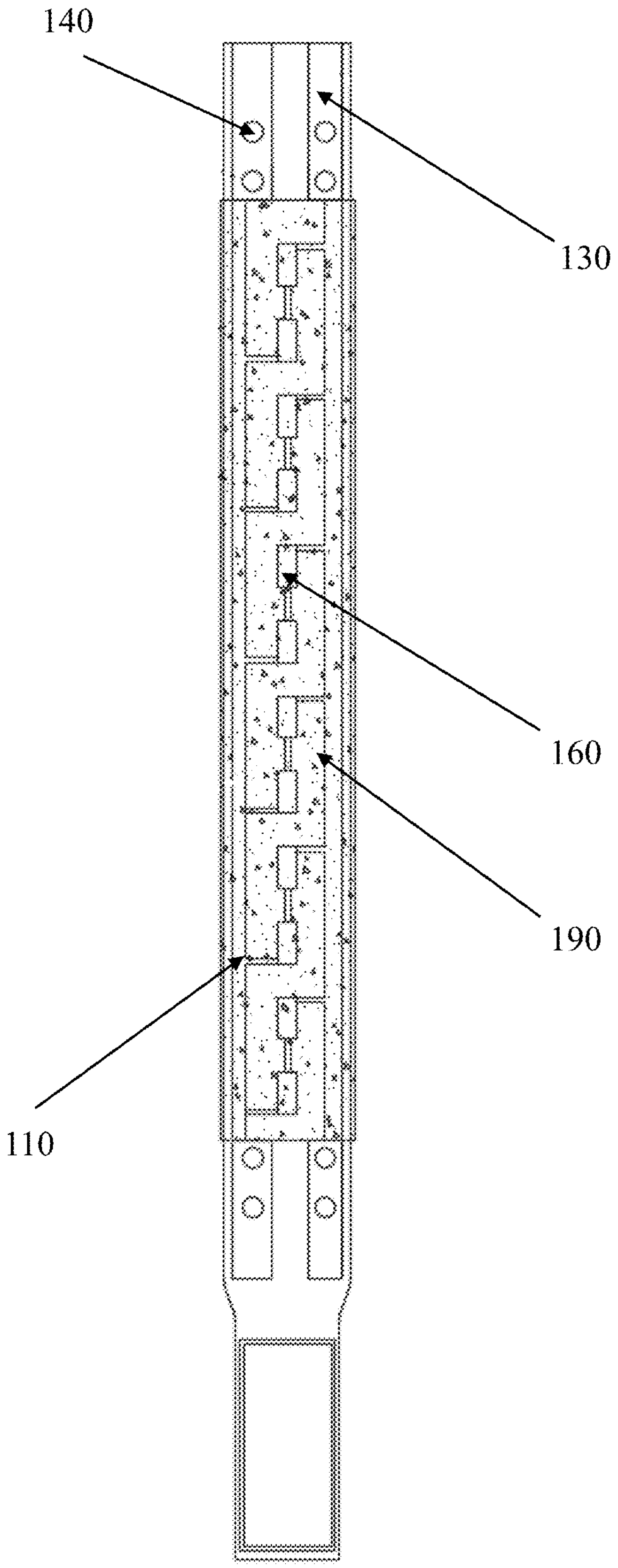
FIG. 4 is a schematic diagram illustrating a partial enlargement of a flexible filament splicing structure according to some embodiments of the present disclosure.
Figure 5:
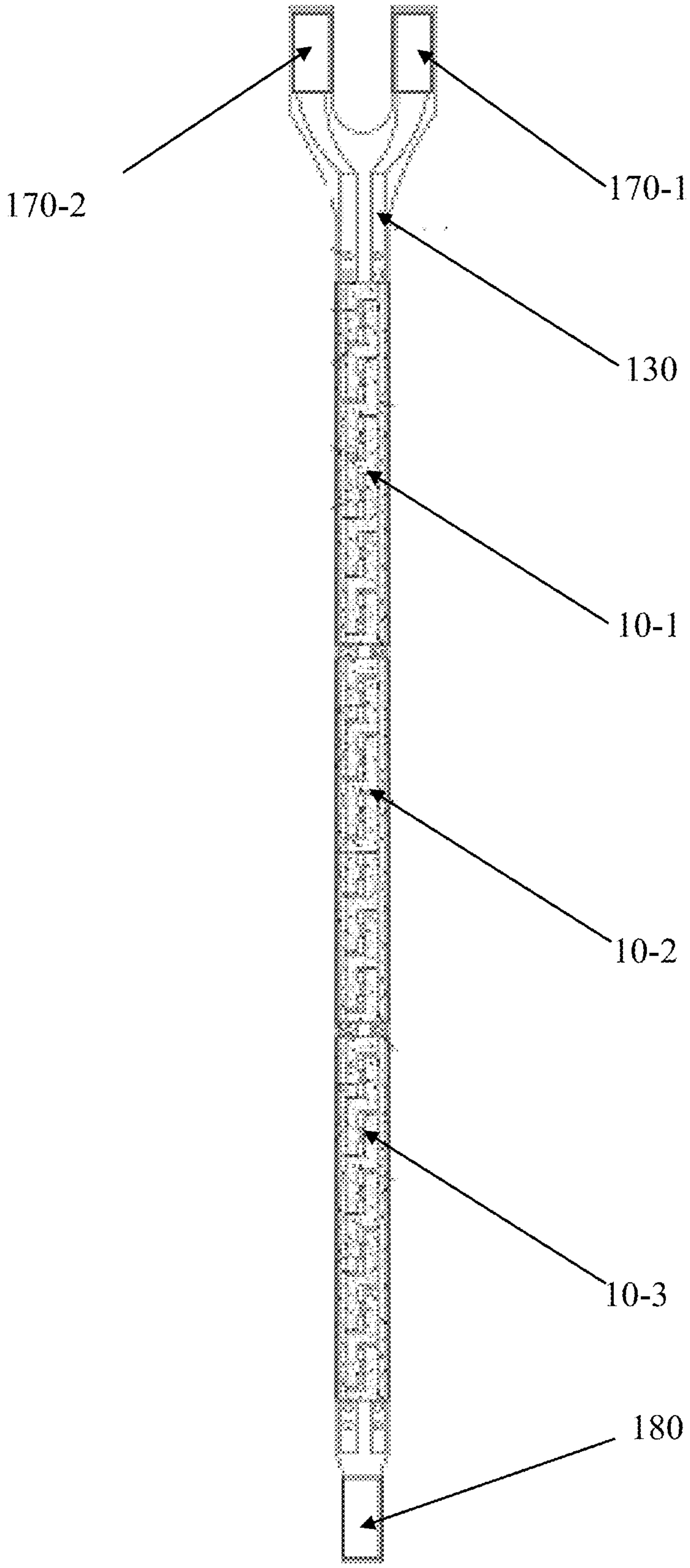
FIG. 5 is a schematic diagram illustrating connection of a plurality of flexible filaments according to some embodiments of the present disclosure.

FIG. 1 is a schematic structural diagram illustrating a plurality of flexible filaments according to some embodiments of the present disclosure. FIG. 2 is a schematic structural diagram illustrating a plurality of flexible filaments according to some embodiments of the present disclosure. FIG. 3 is a schematic diagram illustrating a partial enlargement of a flexible filament splicing structure according to some embodiments of the present disclosure. FIG. 4 is a schematic diagram illustrating a partial enlargement of a flexible filament splicing structure according to some embodiments of the present disclosure. FIG. 5 is a schematic diagram illustrating connection of a plurality of flexible filaments according to some embodiments of the present disclosure. In some embodiments, as illustrated in FIG. 1, FIG. 2, and FIG. 3, the flexible filament splicing structure may comprise a plurality of the flexible filaments 10. Each of the plurality of flexible filaments 10 may include a flexible substrate 120 and at least one LED chip 160.

The flexible substrate 120 is a flexible board. A shape of the flexible substrate 120 may be changed. For example, the flexible substrate 120 may be bent to form a ring. In some embodiments, the flexible substrate 120 may be made of a flexible material such as at least one of polyimide or a polyester film, etc.

In some embodiments, a conductive circuit layer 110 may be disposed on the flexible substrate 120.

The conductive circuit layer 110 may include a conductive circuit. In some embodiments, the conductive circuit layer 110 may be electrically connected with a power supply to form a loop. In some embodiments, the conductive circuit layer 110 may include a fire wire and a zero wire. The fire wire and the zero wire may be electrically connected. In some embodiments, the conductive circuit layer 110 may be disposed on the flexible substrate 120 in various ways, such as at least one of adhesive bonding, soldering, etc. In some embodiments, the conductive circuit layer 110 may be made of a metal wire. The metal wire may include at least one of a copper wire, a tungsten wire, etc.

The at least one LED chip 160 is capable of emitting light when being energized. In some embodiments, the at least one LED chip 160 may be provided on the flexible substrate 120. The at least one LED chip 160 may be electrically connected with the conductive circuit layer 110. In some embodiments, the at least one LED chip 160 may be connected in series or parallel with the conductive circuit layer 110.

In some embodiments, two adjacent flexible filaments 10 may be electrically spliced with each other to enable the plurality of flexible filaments 10 to form an integrated spliced structure. For example, as illustrated in FIG. 5, a flexible filament 10-1, a flexible filament 10-2, and a flexible filament 10-3 may be electrically spliced with each other.

Electrical splicing means that the two flexible filaments 10 are capable of being detachably connected, while the two flexible filaments 10 are capable of being electrically connected. In some embodiments, the conductive circuit layers 110 of the two adjacent flexible filaments 10 may be electrically connected with each other.

In some embodiments of the present disclosure, by electrically splicing the plurality of flexible filaments, the plurality of flexible filaments may be connected or bent to form a desired shape, thereby increasing an overall length of the plurality of flexible filaments.

In some embodiments, as illustrated in FIG. 4, at least two conductive connection ends 130 may be disposed on each of the plurality of flexible filaments 10.

The at least two conductive connection ends 130 are conductive structures. In some embodiments, the at least two conductive connection ends 130 may be electrically connected with the conductive circuit layer 110. In some embodiments, two conductive connection ends 130 may be disposed at two ends of each of the plurality of flexible filaments 10, respectively. The two conductive connection ends 130 disposed at a same end may be electrically connected with the fire wire and the zero wire of the conductive circuit layer 110, respectively. In some embodiments, the at least two conductive connection ends 130 may have a sheet-like structure capable of conducting electricity, such as a copper sheet, etc. In some embodiments, four, six, or more conductive connection ends 130 may be disposed at the two ends of each of the plurality of flexible filaments 100.

In some embodiments, the two adjacent flexible filaments 10 may be electrically spliced with each other through respective conductive connection ends 130 to form the integrated spliced structure. In some embodiments, the conductive connection ends 130 of the two flexible filaments 10 may be electrically spliced with each other in various ways, such as at least one of bonding, soldering, snap-fitting, etc.

In some embodiments of the present disclosure, the two flexible filaments may be connected with each other and capable of being electrically conductive using the conductive connection ends, so that the plurality of flexible filaments can be connected with each other to obtain a desired length or shape.

In some embodiments, the at least two conductive connection ends 130 may protrude from the two ends of each of the plurality of flexible filaments 10. In some embodiments, a length direction of the at least two conductive connection ends 130 may be parallel to a length direction of the plurality of flexible filament 10. In some embodiments, the two conductive connection ends 130 disposed at the same end of each of the plurality of flexible filaments 10 may be parallel to each other.

In some embodiments of the present disclosure, the at least two conductive connection ends may protrude from the two ends of each of the plurality of flexible filaments, so that surface areas of the at least two conductive connection ends can be increased, and the conductive connection ends of the two flexible filaments can be conveniently connected with each other. In addition, the plurality of flexible filaments can be prevented from interfering with the connection.

In some embodiments, as illustrated in FIG. 1, a plurality of bonding pads 150 may be disposed on the conductive circuit layer 110. The plurality of bonding pads 150 may be electrically connected with the conductive circuit layer 110. The at least one LED chip 160 may be disposed on the plurality of bonding pads 150. The at least one LED chip 160 may be flip-flop.

The plurality of bonding pads 150 may serve as mounting bases for mounting the at least one LED chip 160. In some embodiments, two of the plurality of bonding pads 150 may form a group. The two bonding pads 150 of one group may be disconnected from each other, and each of the at least one LED chip 160 may be electrically connected with the two bonding pads 150 of one group so that all the LED chips may be turned on when the conductive circuit layer 110 is powered on. In some embodiments, the plurality of bonding pads 150 distributed in groups may be connected in parallel between the zero wire and the fire wire of the conductive circuit layer 110. In some embodiments, the plurality of bonding pads 150 may be disposed on the flexible substrate 120 by tin soldering.

In some embodiments, the conductive circuit layer 110 may be disposed on a front side and a back side of the flexible substrate 120. The at least two LED chips 160 may be arranged on the front side and the back side of the flexible substrate 120, respectively.

In some embodiments of the present disclosure, by providing the conductive circuit layer and the at least two LED chips on the front and the back side of the flexible substrate, both sides of the plurality of flexible filaments can emit light after being energized without a dead space of a light source, thereby improving the luminous effect of the plurality of flexible filaments.

In some embodiments, the front side and the back side of the flexible substrate 120 may be coated with a fluorescent adhesive 190, respectively. The at least two LED chips 160 may be provided on the front side and the back side of the flexible substrate 120, respectively. The at least two LED chips may be encapsulated in the fluorescent adhesive 190.

In some embodiments of the present disclosure, by using the fluorescent adhesive to encapsulate the at least two LED chips, the at least two LED chip and the conductive circuit layer can be protected from being affected by moisture and damage. When the at least two LED chips emit light, the fluorescent adhesive can make the light more uniform and vivid, and can avoid generating glare, preventing the user from experiencing glare and other discomfort during use. The fluorescent adhesive can also fill in splicing positions of the plurality of flexible filaments, avoiding poor luminous continuity caused by the formation of a broken light shadow in the splicing positions of the long flexible filaments.

In some embodiments, the two adjacent flexible filaments 10 may be electrically spliced with each other by soldering. In some embodiments, the two flexible filaments 10 may be soldered to each other through the conductive connection ends 130 to form electrical splicing.

In some embodiments of the present disclosure, a connection strength between the conductive connection ends of the two flexible filaments can be improved by soldering.

In some embodiments, each of the at least two conductive connection ends 130 may be provided with at least one solder hole 140.

The at least one weld hole 140 is at least one through hole provided in the at least two conductive connection ends 130.

During soldering, the at least one solder hole 140 is capable of accommodating melted solder to avoid the solder from forming a large bump on surfaces of the at least two conductive connection ends 130.

In some embodiments, the solder holes 140 of the respective conductive connection ends 130 of the two adjacent flexible filaments 100 may be aligned and overlapped to be electrically spliced by soldering and fixing. By aligning and stacking the solder holes 140 provided in the two conductive connection ends 130, the positioning accuracy of the two conductive connection ends 130 can be improved. In some embodiments, two or more solder holes 140 may be provided in the two conductive connection ends 130. The two or more solder holes 140 provided in the two conductive connection ends 130 may be aligned and overlapped, thereby further improving the positioning accuracy of the two conductive connection ends 130.

In some embodiments of the present disclosure, the plurality of flexible filaments may be overlapped and fixed by the at least one weld hole provided in the at least two conductive connection ends, so that the long flexible filament can be obtained, and a length of the long flexible filament can be changed based on use scenarios, which is simple and convenient.

In some embodiments, the soldering may include tin soldering. A solder used in the tin soldering may include tin. The soldering may be performed within a small range using the tin soldering, which is suitable for soldering the at least two conductive connection ends. The soldering may also be performed using other feasible soldering modes.

In some embodiments, the two adjacent flexible filaments 10 may be bonded with a conductive adhesive to form electrical splicing. The conductive adhesive is firm in bonding and easy to operate without additional conductive structures.

The conductive adhesive is an adhesive that has a certain conductivity. For example, the conductive adhesive may include at least one of a silver-based conductive adhesive, a gold-based conductive adhesive, a copper-based conductive adhesive, a carbon-based conductive adhesive, etc.

Figure 6:
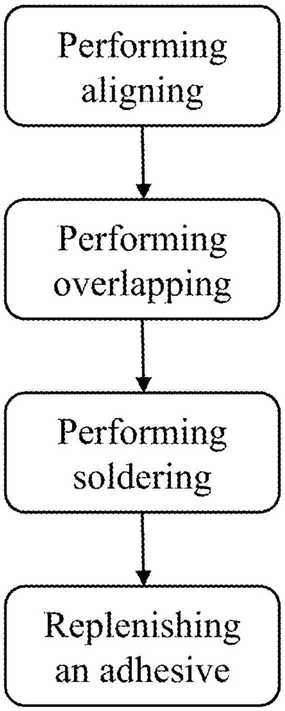
FIG. 6 is a flowchart illustrating a splicing process of a flexible filament splicing structure according to some embodiments of the present disclosure.
Figure 7:
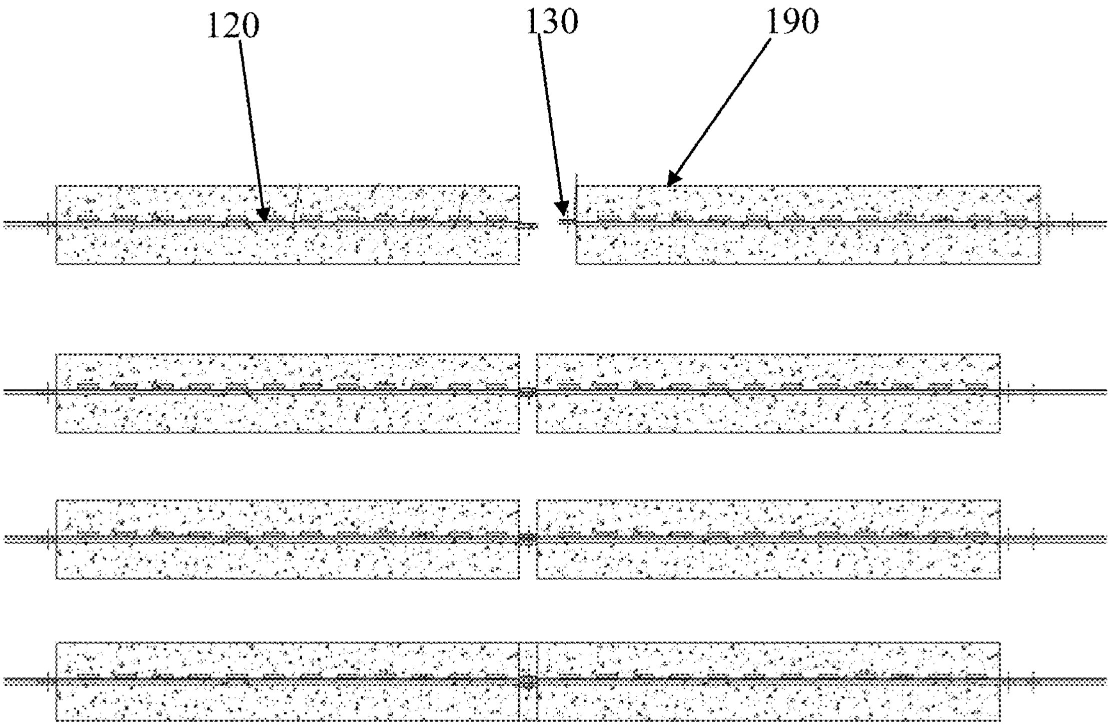
FIG. 7 is a schematic diagram illustrating a splicing process of a flexible filament splicing structure according to some embodiments of the present disclosure.

FIG. 6 is a flowchart illustrating a splicing process of a flexible filament splicing structure according to some embodiments of the present disclosure. FIG. 7 is a schematic diagram illustrating a splicing process of a flexible filament splicing structure according to some embodiments of the present disclosure.

In some embodiments, splicing positions of the two adjacent flexible filaments 10 may be coated and cured with a fluorescent adhesive.

The fluorescent adhesive is a glue made of a polymer material that is auto-fluorescent and has a bonding effect. Using the fluorescent adhesive coated at the splicing positions of the two flexible filaments 10 may restrict the at least two conductive connection ends 130 within the cured fluorescent adhesive, thereby realizing an insulation effect. In addition, when the two flexible filaments 10 emit light, the cured fluorescent adhesive may also emit light, enabling the plurality of interconnected flexible filaments 10 to form a continuous luminescent band, and avoiding black dots that cannot emit light forming on the luminescent band.

In some embodiments, as illustrated in FIG. 6 and FIG. 7, the splicing process of the flexible filament splicing structure may include the following operations.

S1: Aligning may be performed. The conductive connection ends 130 of the two flexible filaments 10 may be aligned, respectively.

S2: Overlapping may be performed. Relative positions of the two flexible filaments 10 may be adjusted so that the solder holes 140 provided in the aligned conductive connection ends 130 may overlap, respectively.

S3: Soldering may be performed. The aligned conductive connection ends 130 may be soldered so that the solder may fall in the overlapped solder holes 140 until the melted solder fills in the solder holes 140. The melted solder may cool and solidify, and the soldering may be completed.

S4: An adhesive may be replenished. The fluorescent adhesive may be coated around the conductive connection ends 130 so that the fluorescent adhesive may completely cover the conductive connection ends 130. The fluorescent adhesive may solidify, and adhesive replenishment may be completed.

In some embodiments, as illustrated in FIG. 3, when there is a plurality of LED chips 160 are provided, the plurality of LED chips 160 may be connected in series or parallel through the conductive circuit layer 110. In some embodiments, the plurality of LED chips 160 may be connected between a fire wire and a zero wire. In some embodiments, a plurality of parallel branches may be provided between the fire wire and the zero wire. The plurality of LED chips 160 may be electrically connected with the plurality of parallel branches to form a parallel relationship. In some embodiments, the plurality of LED chips 160 may be connected in series on the conductive circuit layer 110. In some embodiments, the plurality of LED chips 160 may be connected in series, and then connected between the fire wire and the zero wire to form a series branch.

Some embodiments of the present disclosure, a coverage area of light emitted from the plurality of LED chip can be improved using the plurality of LED chips, and the luminous effect of the plurality of flexible filaments can be enhanced, thereby making the light emitted from each part of the plurality of flexible filaments uniform. The plurality of LED chips may be connected in parallel through the conductive circuit layer so that the use effect of other LED chips cannot be affected in the event that one of the LED chips of one parallel branch is disconnected.

In some embodiments, as illustrated in FIG. 1 and FIG. 5, in the integrated spliced structure formed by the plurality of flexible filaments 10, one or two contact pieces may be disposed at one end of the flexible filament 10 disposed at an end. The one or two contact pieces may be electrically connected with the conductive circuit layer 110.

The one or two contact pieces may be connected with a power supply so as to form a loop between the power supply and the conductive circuit layer 110 to energize the plurality of LED chips 160 to emit light. In some embodiments, the one or two contact pieces may be sheet-like structures capable of conducting electricity, such as at least one of a copper sheet, an iron sheet, etc. In some embodiments, the one or two contact pieces may be connected with the conductive connection ends 130. In some embodiments, the one or two contact pieces may be removably connected with the conductive connection ends 130 in various ways. For example, the one or two contact pieces may be removably connected with the conductive connection ends 130 by cutting. As another example, the one or two contact pieces may be detachably connected with the conductive connection ends 130. The detachable connection may include at least one of a snap-fitting, a buckling, etc. After the one or two contact pieces are disconnected from the conductive connection ends 130, the conductive connection ends 130 may be soldered. In some embodiments, outer sides of the one or two contact pieces may be covered with the fluorescent adhesive. When the one or two contact pieces are connected with the conductive connection ends 130, the fluorescent adhesive may cover the one or two contact pieces and the conductive connection ends 130.

In some embodiments, when the two contact pieces are disposed at the same end of the integrated spliced structure, the two contact pieces disposed at the same end of the integrated spliced structure may be electrically connected with a positive pole and a negative pole of the power supply, respectively, so that the power supply and the conductive circuit layer 110 on the flexible filament 100 may form a loop. In some embodiments, when at least one contact piece is disposed at two ends of the integrated spliced structure, the at least one contact piece disposed at the two ends of the integrated spliced structure may be electrically connected with the positive pole and the negative pole of the power supply, respectively, so that the power supply and the conductive circuit layer 110 on the flexible filament 100 may form a loop.

In some embodiments of the present disclosure, the plurality of flexible filaments may be connected with the power supply by providing the one or two contact pieces. When the plurality of flexible filaments need to be spliced, the one or two contact pieces may be disconnected. The removable or disconnectable contact pieces are convenient for the plurality of flexible filaments to be used based on the actual needs after uniform production.

In some embodiments, in the integrated spliced structure formed by the plurality of flexible filaments 10, one end of a first flexible filament 10-1 may be provided with a first contact piece electrically connected with the conductive circuit layer 110, and the other end of the first flexible filament 10-1 may be electrically connected with an adjacent flexible filament 10-2. One end of a last flexible filament 10-3 may be electrically connected with the adjacent flexible filament 10-2, and the other end of the last flexible filament 10-3 may be provided with a second contact piece electrically connected with the conductive circuit layer 110.

In some embodiments, the first contact piece may be connected with one of a zero wire or a fire wire of the conductive circuit layer 110, and the second contact piece may be connected with the other of the zero wire or the fire wire of the conductive circuit layer 110.

In some embodiments, one first contact piece and two second contact pieces may be provided. The one first contact piece may be connected with one of the zero wire or the fire wire. The two second contact pieces may be electrically connected with the zero wire and the fire wire of the conductive circuit layer 110, respectively.

In some embodiments, the first contact piece and the second contact piece may be connected with the positive pole and the negative pole of the power supply, respectively. For example, the first contact piece may be connected with the positive pole of the power supply, and the second contact piece may be connected with the negative pole of the power supply. In some embodiments, structures of the first contact piece and the second contact piece may be the same or different.

In some embodiments, when each of the plurality of flexible filaments 10 leaves the factory, the two ends of each of the plurality of flexible filaments 10 may be provided with the first contact piece and the second contact piece, respectively, to facilitate uniform production. The first contact piece and/or the second contact piece may be retained in use as needed.

The splicing of the plurality of flexible filaments is further illustrated by taking the splicing of three flexible filaments as an example.

In some embodiments, the first contact piece disposed at one end of a first flexible filament may be retained, and the second contact piece disposed at the other end of the first flexible filament may be cut, retaining the conductive circuit layer and the conductive connection ends. The first contact piece and the second contact piece disposed at two ends of a second flexible filament may be completely cut, and only the conductive circuit layer and the conductive connection ends connected with the two ends of the conductive circuit layer may be retained. The first contact piece disposed at one end of a third flexible filament may be cut, and the conductive circuit layer, the conductive connection ends and the second contact piece may be retained. Then the three flexible filaments may be overlapped and fixed through overlapping and fixing of weld holes disposed in the conductive connection ends to complete electrical connection. Then connection positions may be replenished with a fluorescent adhesive so that splicing of long flexible filaments may be completed.

When more than three flexible filaments need to be spliced, first and last flexible filaments may be cut in the same way, only a count of intermediate flexible filaments may be increased, and then the flexible filaments may be overlapped and fixed so that more than three long flexible filaments may be spliced.

In some embodiments, as illustrated in FIG. 5, in the integrated spliced structure formed by the plurality of flexible filaments 10, one end of the first flexible filament 10-1 may be provided with a third contact piece 170-1 and a fourth contact piece 170-2 electrically connected with the conductive circuit layer 110, and one end of the last flexible filament 10-3 may be electrically connected with the adjacent flexible filament 10-2. In some embodiments, as illustrated in FIG. 5, the other end of the last flexible filament 10-3 may be provided with a fifth contact piece 180 electrically connected with the conductive circuit layer 110. In some embodiments, the other end of the last flexible filament 10-3 may be provided with a connection structure.

In some embodiments, the third contact piece 170-1 and the fourth contact piece 170-2 may be electrically connected with the zero wire and the fire wire of the conductive circuit layer 110, respectively. In some embodiments, the third contact piece 170-1 and the fourth contact piece 170-2 may be electrically connected with the positive pole and the negative pole of the power supply, respectively, so that the power supply and the conductive circuit layer 110 may form a loop.

In some embodiments, the fifth contact piece 180 may be connected with one of the fire wire and the zero wire of the conductive circuit layer 110.

The connection structure may be configured to enable the plurality of flexible filaments 10 to be connected with other structures, such as at least one of a wall, a door, a window, a tree, etc. The connection structure may be configured to remain the plurality of flexible filaments 10 fixed. In some embodiments, the connection structure may include various configurations, such as at least one of a hook, a suction cup, a magnet, etc. The connection structure may be hung in an appropriate position using the hook. The connection structure may be adhered to a smooth surface using the suction cap, such as a glass, a door, a window, etc. The connection structure may be adsorbed with a magnetic metal using the magnet. In some embodiments, the connection structure may be insulated from the conductive circuit layer 110.

In some embodiments, the other end of the last flexible filament 10 may not need electrical connection. The end of the last flexible filament may serve as a connection end or a vacant end. The connection end or the vacant end may be connected with the connection structure, or may serve as a part of the connection structure forming non-electrical connection with an external device. The connection structure may include a magnetic bead or an iron bead as a functional part of a magnetic light.

In some embodiments, when each of the plurality of flexible filaments 10 leaves the factory, the two ends of each of the plurality of flexible filaments 10 may be provided with the third contact piece 170-1 and the fourth contact piece 170-2, respectively, to facilitate uniform production. The third contact piece 170-1 and/or the fourth contact piece 170-2 may be retained or cut as needed.

The splicing of the plurality of flexible filaments is further illustrated by taking the splicing of the three flexible filaments as an example.

In some embodiments, one end of each of the plurality of flexible filaments may be provided with the third contact piece and the fourth contact piece electrically connected with the conductive circuit layer. The third contact piece and the fourth contact piece may be disposed at the same end of each of the plurality of flexible filaments. One of the third contact piece and the fourth contact piece may be electrically connected with the conductive circuit layer. The third contact and the fourth contact may be connected with a power supply to form a loop for lighting up the at least one LED chip.

When long flexible filaments are spliced, contact pieces disposed at the other end of a first flexible filament may be cut, the third contact piece and the fourth contact piece disposed at one end of the first flexible filament may be retained, and the conductive circuit layer and the conductive connection ends may be retained. The third contact piece and the fourth contact piece disposed at two ends of a second flexible filament may be cut, only the conductive circuit layer and the conductive connection ends connected with the two ends of the conductive circuit layer may be retained. The third contact piece and the fourth contact piece disposed at one end of a third flexible filament may be cut, and the conductive circuit layer and the conductive connection ends may be retained. Then the three flexible filaments may be overlapped and fixed through overlapping and fixing of weld holes disposed in the conductive connection ends to complete electrical connection. Then connection positions may be replenished with a fluorescent adhesive so that splicing of the long flexible filaments may be completed.

Figure 8:
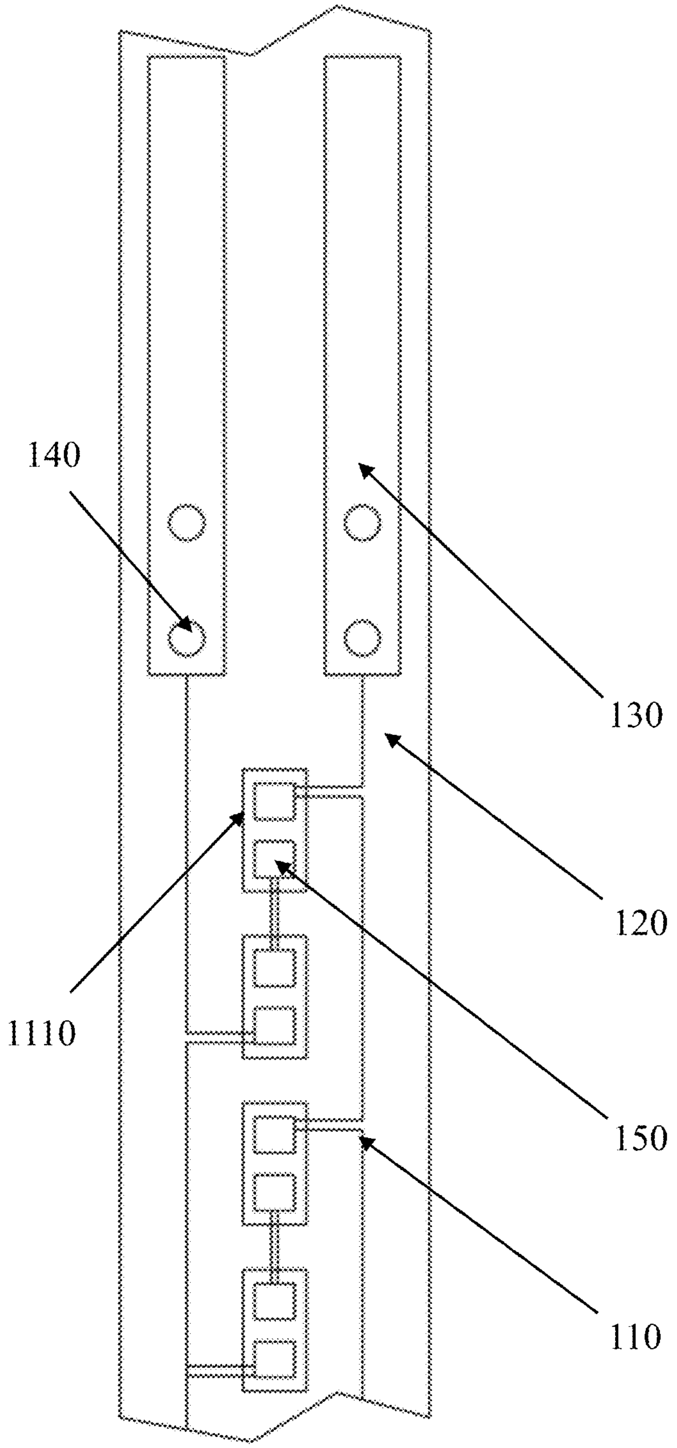
FIG. 8 is a schematic structural diagram illustrating a reinforcing plate according to some embodiments of the present disclosure.

FIG. 8 is a schematic structural diagram illustrating a reinforcing plate according to some embodiments of the present disclosure. In some embodiments, as illustrated in FIG. 8, a flexible filament splicing structure may further include a reinforcing plate 1100. The reinforcing plate 1100 may be disposed at a position of the flexible substrate 120 where the at least one LED chip 160 is located.

The reinforcing plate 1100 may be configured to enhance an effect of the flexible substrate 120 in supporting the at least one LED chip 160. When the flexible substrate 120 is bent, the reinforcing plate 1100 is able to reduce stretching and bending of the at least one LED chip 160 and avoid damage to the at least one LED chip 160. In some embodiments, the at least two bonding pads 150 may be disposed on the reinforcing plate 1100. The at least two bonding pads 150 may be insulated from the reinforcing plate 1100. In some embodiments, the conductive circuit layer 110 may be insulated from the reinforcing plate 1100. In some embodiments, the reinforcing plate 1100 may be made of various materials, such as at least one of fiberglass cloth (FR4), polyimide, stainless steel, aluminum, etc. In some embodiments, the reinforcing plate 1100 may be disposed on the flexible substrate 120 in various ways, such as, at least one of thermal bonding, bonding using a pressure sensitive adhesive, etc. In some embodiments, an area of the reinforcing plate 1100 may be greater than an area of the at least one LED chip 160, thereby realizing the effect of protecting the at least one LED chip 160.

In some embodiments of the present disclosure, a thickness of the flexible substrate may be increased and the support capacity of the flexible substrate can be enhanced by using the reinforcing plate. When the flexible substrate is bent, a maximum angle of bending of the flexible substrate may be limited to avoid excessive bending of a structure connected with the flexible substrate caused by the excessive bending of the flexible substrate or to avoid disengaging from the flexible substrate, thereby preventing the at least one LED chip from excessively bending or disengaging from the flexible substrate. The reinforcing plate may also realize heat dissipation for the at least one LED chip, thereby avoiding overheating damage to the at least one LED chip.

Figure 9:
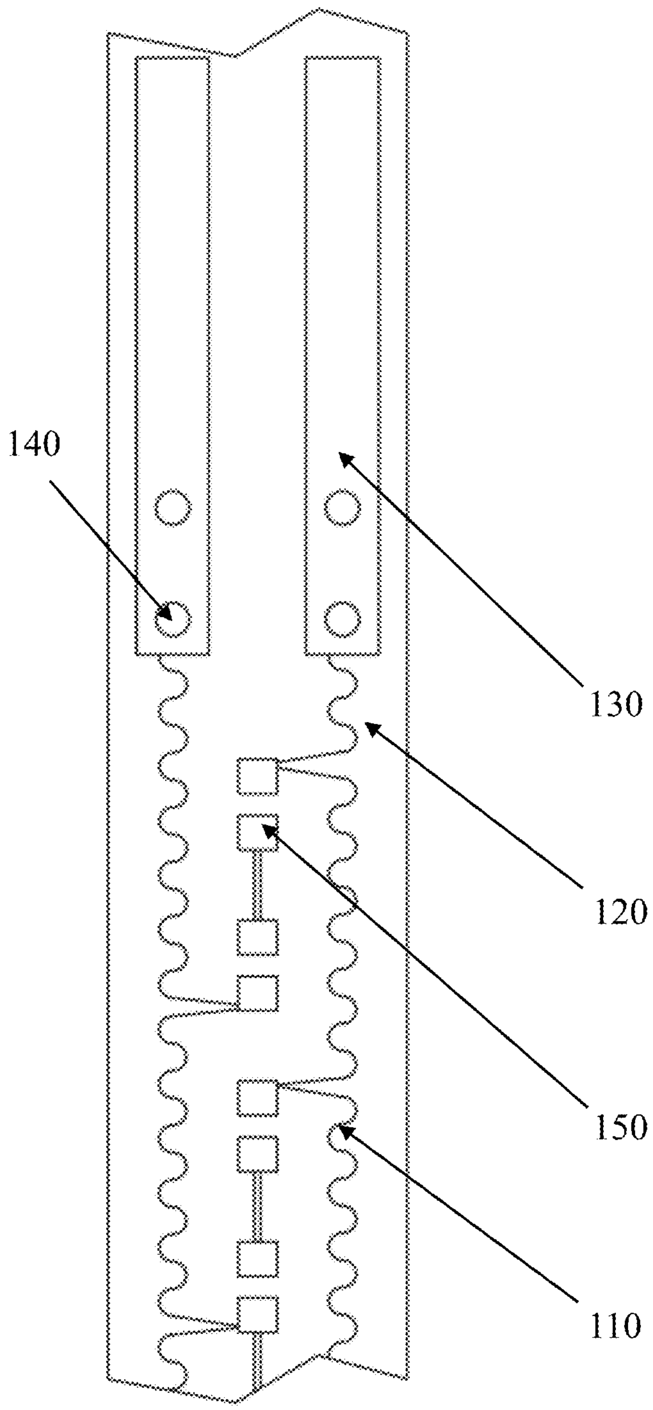
FIG. 9 is a schematic structural diagram illustrating a conductive circuit layer according to some embodiments of the present disclosure.

FIG. 9 is a schematic structural diagram illustrating a conductive circuit layer according to some embodiments of the present disclosure. In some embodiments, as illustrated in FIG. 9, the conductive circuit layer 110 may be provided with a conductor circuit distributed the flexible substrate 120 in a serpentine shape.

The serpentine shape refers to a continuous curved shape, such as at least one of a continuous S-shape, a continuous W-shape, etc.

In some embodiments, the conductive circuit may partially protrude relative to the flexible substrate 120. For example, the conductive circuit may include a plurality of serpentine shapes protruding with respect to the flexible substrate 120. Two ends of each of the plurality of serpentine shapes may be in point contact with the flexible substrate 120. Contact points may be electrically connected with each other and smooth with respect to the flexible substrate 120 without protrusion.

In some embodiments of the present disclosure, by designing the conductive circuit as the serpentine shape, a ductility of the conductive circuit layer may be enhanced. When the flexible substrate is bent, the conductive circuit layer is able to better adapt to and follow the bending of the flexible substrate, which is conducive to reducing bending stress of the conductive circuit layer, and avoiding damage to the conductive circuit layer. The conductive circuit may be in point contact with the flexible substrate and the conductive circuit may form serpentine protrusions between the two contact points, so that the ductility of the conductive circuit layer can be further enhanced.

Figure 10:
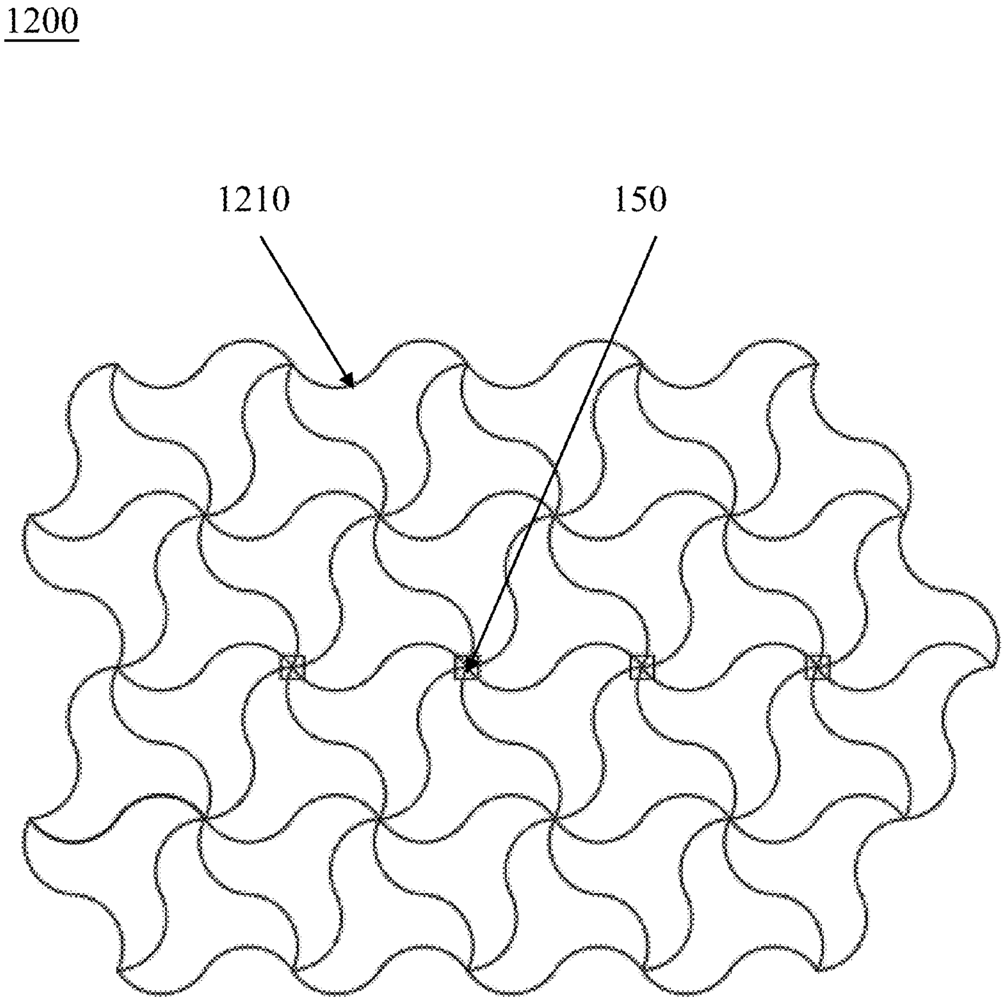
FIG. 10 is a schematic structural diagram illustrating a reinforcing layer according to some embodiments of the present disclosure.

FIG. 10 is a schematic structural diagram illustrating a reinforcing layer according to some embodiments of the present disclosure. In some embodiments, as illustrated in FIG. 10, a flexible filament splicing structure may further include at least one reinforcing layer 1200. The at least one reinforcing layer 1200 may be disposed on the flexible substrate 120. The at least one reinforcing layer 1200 may have a cellular mesh structure.

The reinforcing layer 1200 may be configured to increase an overall strength and bending capacity of the flexible substrate 120. In some embodiments, the cellular mesh structure may be formed using a plurality of interconnected reinforcing wires 1210. In some embodiments, each mesh of the cellular mesh structure may include three edges and three vertices. Each of the three edges may include one reinforcing wire 1210. In some embodiments, six reinforcing wires 1210 may be attached to one of the three vertices. In some embodiments, the plurality of reinforcing wires 1210 may be S-shaped. In some embodiments, the mesh may also include other counts of vertices or edges, such as four vertices, six vertices, etc. In some embodiments, each of the planarity of reinforcing wires 1210 may have the same shape. The plurality of reinforcing filaments 1210 corresponding to the same vertex in the cellular mesh structure may be rotationally symmetric.

In some embodiments, each of the plurality of bonding pads 150 may be connected with one of the vertices. A distance between two adjacent vertices may be a distance between centers of two bonding pads 150 of a set of bonding pads 150. In some embodiments, the conductive circuit layer 110 may be disposed on the reinforcing layer 1200. The conductive circuit layer 110 may be insulated from the reinforcing layer 1200.

In some embodiments, when the reinforcing layer 1200 is connected with the flexible substrate 120, the flexible substrate 120 may be in a tensile state, and then the reinforcing layer 1200 may cover the flexible substrate 120 so that each of the plurality of reinforcing wires 1210 in the reinforcing layer 1200 may be connected with the flexible substrate 120. In some embodiments, a datum line may be disposed on the flexible substrate 120, and a shape of the datum line may be the same as a shape of the reinforcing layer 1200 after the flexible substrate 120 is stretched. In this way, positioning and mounting of the reinforcing layer 1200 may be facilitated, which is conducive to improving the mounting accuracy of the reinforcing layer 1200. In some embodiments, the reinforcing layer 1200 may be disposed on a front side and a back side of the flexible substrate 120.

In some embodiments, the reinforcing layer 1200 may be made of various materials, such as at least one of fiberglass fabric (FR4), polyimide, polydimethylsiloxane (PDMS), stainless steel, aluminum, etc.

In some embodiments of the present disclosure, a stress generated by repeated bending of the flexible substrate may be reduced by using the reinforcing layer, thereby avoiding deformation or damage to the flexible substrate by the stress. The reinforcing layer may also enhance a strength of the flexible substrate. Correspondingly, a thickness of the flexible substrate may be reduced or the flexible substrate may be directly replaced under the condition of satisfying the strength, which is conducive to reducing an overall weight of the flexible filament. The S-shaped reinforcing wires are capable of adapting to bending and stretching in a plurality of directions, thereby improving the scope of application of the plurality of flexible filaments.

Figure 11:
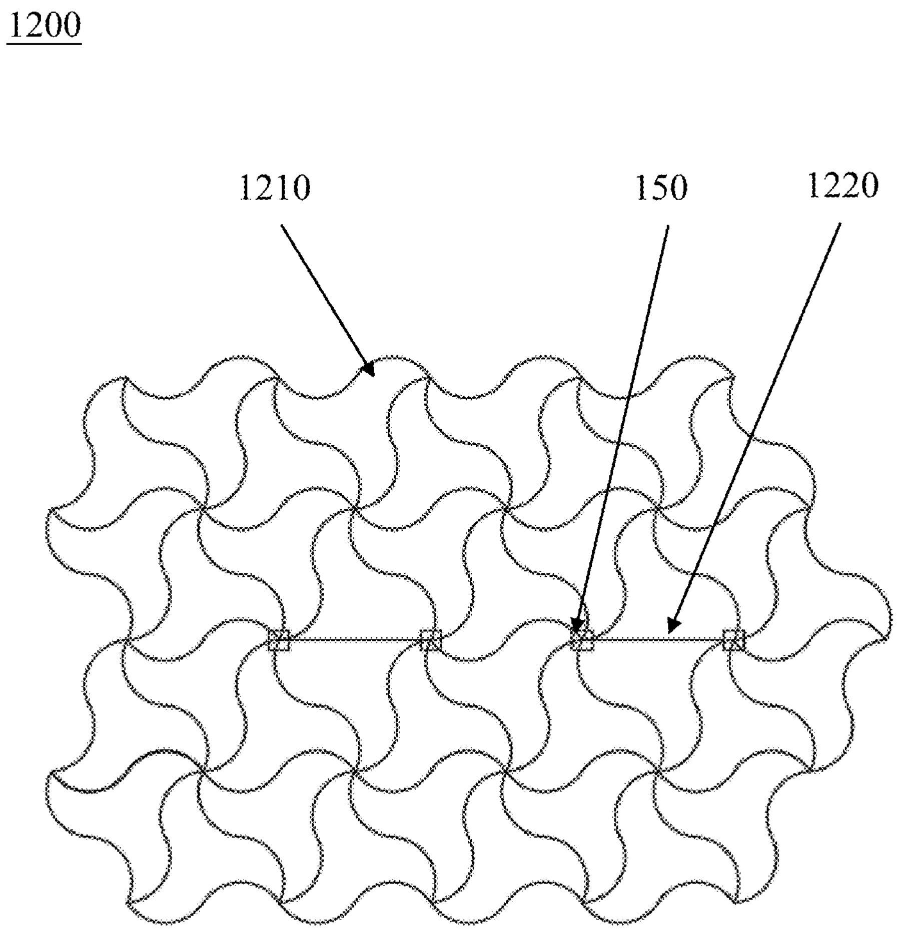
FIG. 11 is a schematic structural diagram illustrating a reinforcing layer according to some embodiments of the present disclosure.

FIG. 11 is a schematic structural diagram illustrating a reinforcing layer according to some embodiments of the present disclosure. In some embodiments, as illustrated in FIG. 11, the reinforcing layer 1200 may further include a central reinforcing wire 1220. In some embodiments, the central reinforcing wire 1220 may be linear. In some embodiments, vertices disposed at two ends of the central reinforcing wire 1220 may be vertices corresponding to the plurality of bonding pads 150.

In some embodiments, a stretching and bending capacity of the central reinforcing wire 1220 may be less than that of the S-shaped reinforcing wires 1210.

Figure 12:
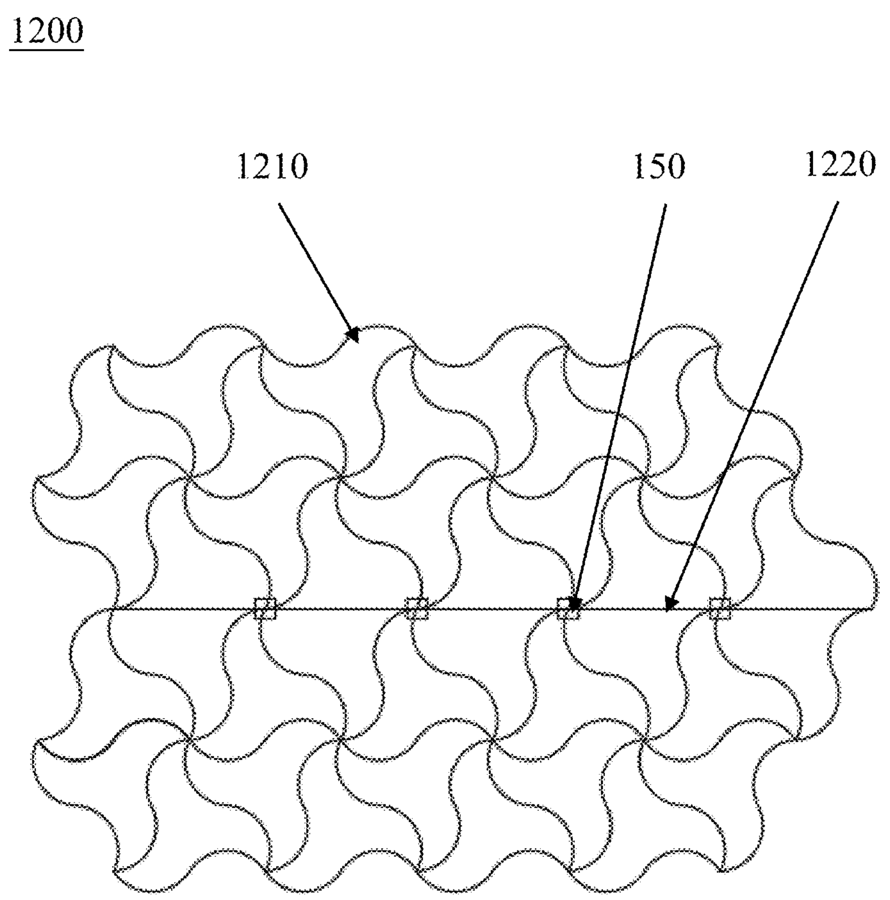
FIG. 12 is a schematic structural diagram illustrating a reinforcing layer according to some embodiments of the present disclosure.

FIG. 12 is a schematic structural diagram illustrating a reinforcing layer according to some embodiments of the present disclosure.

In some embodiments, as illustrated in FIG. 12, vertices corresponding to the plurality of bonding pads 150 may be located on the same straight line. The plurality of bonding pads 150 may be correspondingly connected with the plurality of LED chips 160. For example, four bonding pads 150 may be correspondingly connected with two LED chips 160, six bonding pads 150 may be correspondingly connected with three LED chips 160, etc. In some embodiments, as illustrated in FIG. 12, the central reinforcing wire 1220 may cover the vertices corresponding to the plurality of bonding pads 150.

In some embodiments of the present disclosure, a bending degree of the flexible substrate at the central reinforcing wire may be limited by the central reinforcing wire, so that the damage to the plurality of LED chips 160 caused by a large bending moment borne by the plurality of LED chips 160 can be avoided. The central reinforcing wire may cover the vertices corresponding to the plurality of bonding pads, so that the processing difficulty of the reinforcing layer can be reduced, and the protection of the central reinforcing wire for the plurality of LED chips can be enhanced.

In some embodiments, the reinforcing layer 1200 may be made of a thermally conductive material, such as a copper wire, etc.

In some embodiments of the present disclosure, the reinforcing layer may be made of the thermally conductive material, so that the heat dissipation effect of the reinforcing layer can be improved, and heat dissipation of the plurality of LED chips can be facilitated, thereby avoiding high temperature damage to the plurality of LED chips.

In some embodiments, two or more reinforcing layers 1200 may be stacked. In some embodiments, the two or more reinforcing layers 1200 may have the same shape. Mesh sizes corresponding to the two or more reinforcing layers 1200 may be the same. In some embodiments, vertices of a cellular mesh structure corresponding to each of the two or more reinforcing layers 1200 may be staggered from each other. An overall strength of the plurality of flexible filaments may be improved after the two or more reinforcing layers are stacked.

In some embodiments, at least one of the two or more reinforcing layers 1200 may be made of the thermally conductive material. For example, the reinforcing layer 1200 close to the plurality of bonding pads 150 may be made of the thermally conductive material. In some embodiments, in the at least one of the two or more reinforcing layers made of the thermally conductive material, a distance between two vertices may be equal to a distance between centers of two bonding pads 150 of a set of bonding pads 150. In other reinforcing layers 1200, the distance between the two vertices may be greater than the distance between the centers of the two bonding pads 150 of the set of bonding pads 150, and the plurality of reinforcing wires may be wider, thereby increasing the reinforcing effect and reducing the difficulty of manufacturing.

In some embodiments, the at least one of the two or more reinforcing layers 1200 made of the thermally conductive material may have a mesh structure. The mesh structure may include a plurality of regularly (e.g., square and rectangular) and/or irregularly shaped meshes. A shape and a size of each mesh in the mesh structure may be the same and/or be different. In some embodiments, a count of vertices of the mesh structure may be the same as a count of the plurality of bonding pads 150. The vertices of the mesh structure may be correspondingly connected with the plurality of bonding pads 150. In this case, the mesh structure may be a row array structure similar to the plurality of bonding pads 150.

The basic concept has been described above. Obviously, for those skilled in the art, the above detailed disclosure is only an example, and does not constitute a limitation to the present disclosure. Although not expressly stated here, those skilled in the art may make various modifications, improvements and corrections to the present disclosure. Such modifications, improvements and corrections are suggested in the present disclosure, so such modifications, improvements and corrections still belong to the spirit and scope of the exemplary embodiments of the present disclosure.

Meanwhile, the present disclosure uses specific words to describe the embodiments of the present disclosure. For example, "one embodiment", "an embodiment", and/or "some embodiments" refer to a certain feature, structure or characteristic related to at least one embodiment of the present disclosure. Therefore, it should be emphasized and noted that references to "one embodiment" or "an embodiment" or "an alternative embodiment" two or more times in different places in the present disclosure do not necessarily refer to the same embodiment. In addition, certain features, structures, or characteristics in one or more embodiments of the present disclosure may be properly combined.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

What is claimed is:

1. A flexible filament splicing structure, comprising a plurality of flexible filaments, wherein each of the plurality of flexible filaments includes a flexible substrate and at least one light-emitting diode (LED) chip;

each flexible substrate is provided with a respective conductive circuit layer, the at least one LED chip is disposed on one of the flexible substrates, and the at least one LED chip is electrically connected with one of the respective conductive circuit layers;

two or more adjacent flexible filaments are electrically spliced with each other to enable the plurality of flexible filaments to form an integrated spliced structure;

wherein at least two conductive connection ends are disposed on each of the plurality of flexible filaments, the at least two conductive connection ends are electrically connected with the respective conductive circuit layer, and the two adjacent flexible filaments are electrically spliced with each other through respective conductive connection ends to form the integrated spliced structure; each of the at least two conductive connection ends is provided with at least one solder hole, and the at least one solder hole provided in the at least two conductive connection ends of each of the two adjacent flexible filaments is aligned and overlapped to be electrically spliced by soldering and fixing; the solder holes are through holes formed on the conductive connection ends, and melted solder is accommodated inside the solder holes; the solder holes are adapted to a splicing assembly mode including alignment, overlapping, solder filling, and solidification; and at least one reinforcing layer is disposed on each flexible substrate, wherein each reinforcing layer has a cellular mesh structure, the cellular mesh structure is formed by a plurality of interconnected S-shaped reinforcing wires, each mesh of the cellular mesh structure is triangular with three edges and three vertices, each vertex of the cellular mesh structure is connected with one bonding pad, and the distance between two adjacent vertices is equal to a center distance between two bonding pads in one group of bonding pads, and each reinforcing layer further comprises a linear central reinforcing wire, two end vertices of the central reinforcing wire being vertices corresponding to the bonding pads matched with each LED chip.

2. The flexible filament splicing structure of claim 1, wherein the soldering includes tin soldering.

3. The flexible filament splicing structure of claim 1, wherein splicing positions of the two adjacent flexible filaments are coated and cured with a fluorescent adhesive.

4. The flexible filament splicing structure of claim 1, wherein a plurality of LED chips are disposed on each of the flexible substrates, and the plurality of LED chips are connected in series or parallel through the respective conductive circuit layers.

5. The flexible filament splicing structure of claim 1, wherein in the integrated spliced structure formed by the plurality of flexible filaments, one or two contact pieces are disposed at one end of each flexible filament located at a respective end, and the one or two contact pieces are electrically connected with the respective conductive circuit layer.

6. The flexible filament splicing structure of claim 5, wherein in the integrated spliced structure formed by the plurality of flexible filaments, one end of a first flexible filament is provided with a first contact piece electrically connected with the respective conductive circuit layer, the other end of the first flexible filament is electrically connected with an adjacent flexible filament; one end of a last flexible filament is electrically connected with an adjacent flexible filament, and the other end of the last flexible filament is provided with a second contact piece electrically connected with the respective conductive circuit layer.

7. The flexible filament splicing structure of claim 5, wherein in the integrated spliced structure formed by the plurality of flexible filaments, one end of a first flexible filament is provided with a third contact piece and a fourth contact piece electrically connected with the respective conductive circuit layer; and one end of a last flexible filament is electrically connected with an adjacent flexible filament.

8. The flexible filament splicing structure of claim 7, wherein the other end of the last flexible filament is provided with a fifth contact piece electrically connected with the respective conductive circuit layer; or the other end of the last flexible filament is provided with a connection structure.

9. The flexible filament splicing structure of claim 1, wherein a plurality of bonding pads are disposed on each of the respective conductive circuit layers, the plurality of bonding pads are electrically connected with the respective conductive circuit layer, and the at least one LED chip is disposed on the plurality of bonding pads.

10. The flexible filament splicing structure of claim 1, wherein the respective conductive circuit layers are disposed on a front side and a back side of each of the flexible substrates, respectively, and at least two LED chips are arranged on the front side and the back side of each of the flexible substrates, respectively.

11. The flexible filament splicing structure of claim 10, wherein the front side and the back side of each of the flexible substrates are coated with a fluorescent adhesive, respectively, and the at least two LED chips are encapsulated in the fluorescent adhesive.

12. The flexible filament splicing structure of claim 1, further comprising a plurality of reinforcing plates, wherein each of the plurality of reinforcing plates is disposed at a position of a respective one of the flexible substrates where a corresponding one of the at least one LED chips is located.

13. The flexible filament splicing structure of claim 12, wherein an area of each of the plurality of reinforcing plates is greater than an area of a corresponding one of the at least one LED chips.

14. The flexible filament splicing structure of claim 1, wherein each of the respective conductive circuit layers is provided with a conductive circuit, and the conductive circuit is arranged on a respective one of the flexible substrates in a serpentine shape;

the serpentine shape refers to a continuous curved shape including a continuous S-shape or a continuous W-shape, the conductive circuit partially protrudes relative to the respective flexible substrate, two ends of each serpentine segment are in point contact with the respective flexible substrate, and the contact positions are smooth without protrusions; and each of the respective conductive circuit layers is configured to adapt to and follow bending of the respective flexible substrate.

15. The flexible filament splicing structure of claim 1, wherein the at least two conductive connection ends protrude from two ends of each of the plurality of flexible filaments, respectively.

16. The flexible filament splicing structure of claim 1, wherein the at least one reinforcing layer serves as a heat dissipation layer and is made of a thermally conductive material, and each of the respective conductive circuit layers is insulated from the heat dissipation layer.

17. The flexible filament splicing structure of claim 16, wherein the cellular mesh structure of the at least one reinforcing layer includes two stacked layers, vertices of the cellular mesh structure corresponding to one of the two stacked layers being staggered from vertices of the cellular mesh structure corresponding to the other of the two stacked layers; one of the two stacked layers is a heat dissipation layer made of copper wire, and the other of the two stacked layers is a reinforcing layer made of aluminum wire, the two stacked layers are staggered, and the heat dissipation layer is closer to the plurality of bonding pads.

18. The flexible filament splicing structure of claim 17, wherein, in the heat dissipation layer made of the thermally conductive material, a distance between two adjacent vertices is equal to the center distance between two bonding pads in one group of bonding pads.

* * * * *